United States Patent [19]
Tokano

[11] Patent Number: 5,625,284
[45] Date of Patent: Apr. 29, 1997

[54] ELECTRIC FIELD SENSOR HAVING SENSOR HEAD WITH UNBALANCED ELECTRIC FIELD SHIELD TO SHIELD BRANCHED OPTICAL WAVEGUIDES AGAINST AN APPLIED ELECTRIC FIELD

[75] Inventor: Yuichi Tokano, Sendai, Japan

[73] Assignee: Tokin Corporation, Miyagi, Japan

[21] Appl. No.: 392,995

[22] PCT Filed: Jul. 7, 1994

[86] PCT No.: PCT/JP94/01104

§ 371 Date: Mar. 7, 1995

§ 102(e) Date: Mar. 7, 1995

[87] PCT Pub. No.: WO95/02192

PCT Pub. Date: Jan. 19, 1995

[30] Foreign Application Priority Data

Jul. 7, 1993 [JP] Japan ................... 5-168020
Mar. 18, 1994 [JP] Japan ................... 6-049178

[51] Int. Cl.$^6$ .............................................. G01R 31/00
[52] U.S. Cl. ......................... 324/96; 324/750; 324/752
[58] Field of Search ....................... 324/72, 96, 750, 324/752

[56] References Cited

U.S. PATENT DOCUMENTS

| | | | |
|---|---|---|---|
| 4,719,412 | 1/1988 | d'Humieres et al. . | |
| 4,840,447 | 6/1989 | Kataoka | 385/5 |
| 4,918,373 | 4/1990 | Newberg | 324/613 |
| 5,082,342 | 1/1992 | Wight et al. | 385/8 |
| 5,129,017 | 7/1992 | Kawano et al. | 385/3 |
| 5,267,336 | 11/1993 | Sriram et al. | 324/96 |
| 5,416,859 | 5/1995 | Burns et al. | 385/3 |

FOREIGN PATENT DOCUMENTS

| | | |
|---|---|---|
| 0187091A1 | 7/1986 | European Pat. Off. . |
| 0454860A1 | 11/1991 | European Pat. Off. . |
| 59-124366 | 8/1981 | Japan . |
| 59-155764 | 9/1984 | Japan . |

OTHER PUBLICATIONS

Journal of Lightwave Technology, vol. LT-5, No. 6, Jun. 6, 1987 New York, pp. 745–750, Jaeger et al, Asymmetric Slab and Strip–Loaded Integrated Optic Devices . . . .

Patent Abstracts of Japan, vol. 11, No. 270 (P-611), Sep. 3, 1987 & JP-A-62-070777 (Fujikura).

Patent Abstracts of Japan, vol. 18, No. 48 (P-1682), Jan. 25, 1994 & JP-A-05 273260 (Yokogawa Electric).

*Primary Examiner*—Kenneth A. Wieder
*Assistant Examiner*—Russell M. Kobert
*Attorney, Agent, or Firm*—Frishauf, Holtz, Goodman, Langer & Chick

[57] ABSTRACT

An electric field sensor comprises a substrate 4, an incident optical waveguide 5 formed on the substrate 4, two branched optical waveguides 6 formed on the substrate 4 to be branched from the incident optical waveguide 5 and having refractive indexes which are variable in response to an electric field intensity applied thereto, an outgoing optical waveguide 7 formed on the substrate 4 to join the branched optical waveguides 6, and an electric field shielding member 8 formed in the vicinity of a part of the branched optical waveguides 6 for shielding an electric field. The substrate 4 may be provided with a reflection mirror 16 for reflecting light beams from the branched optical waveguides 6. The substrate 4 is made of a ferroelectric material and has polarization directions reverse to each other at portions where the two branched optical waveguides 6 are formed.

8 Claims, 6 Drawing Sheets

ELECTRIC FIELD SENSOR HAVING SENSOR HEAD WITH UNBALANCED ELECTRIC FIELD SHIELD TO SHIELD BRANCHED OPTICAL WAVEGUIDES AGAINST AN APPLIED ELECTRIC FIELD

TECHNICAL FIELD

This invention relates to an electric field sensor for measuring a radio wave or an electrode noise and, in particular, to an electric field sensor for measuring an electric field intensity of an electromagnetic wave propagating in a space.

BACKGROUND ART

FIG. 1 shows a structure of a conventional electric field sensor head 101 implemented by a waveguide-type element. The electric field sensor head 101 comprises a substrate 102 made of a lithium niobate crystal which is cut out perpendicularly to a c axis, an incident optical waveguide 103, phase-shift optical waveguides 104 and 105 branched from the incident optical waveguide 103, and an outgoing optical waveguide 106 into which the phase-shift optical waveguides 104 and 105 are joined and coupled. The incident, the phase-shift, and the outgoing optical waveguides are formed by diffusion of titanium on the substrate 102. An incident optical fiber 107 is connected to an incident end of the incident optical waveguide 103 while an outgoing optical fiber 108 is connected to an outgoing end of the outgoing optical waveguide 106.

A pair of electrodes 109 are formed on the phase-shift optical waveguides 104 and 105. These electrodes 109 are connected to rod antennas 110. Referring to FIG. 1, an incident light beam 111 is incident through the incident optical filer 107 to the incident optical waveguide 103 and then divided in energy into the phase-shift optical waveguides 104 and 105. When an electric field is applied, electric voltages are applied to the electrodes 109 by the rod antennas 110. In the phase-shift optical waveguides 104 and 105, electric field components which have directions opposite to each other in depth directions are produced. As a consequence, a variation in refractive index is caused by an electrooptical effect so that a phase difference corresponding to the magnitude of the applied electric field is produced between light waves propagating through the phase-shift optical waveguides 104 and 105. When the light waves are combined and coupled at the outgoing optical waveguide 106, a light intensity is varied due to interference. Specifically, the intensity of an outgoing light beam 112 emitted through the outgoing optical fiber 108 is varied in response to the intensity of the applied electric field. By measuring the variation of the light intensity, it is possible to detect the intensity of the applied electric field.

FIG. 2 shows an electric field sensor using the above-described conventional electric field sensor head 101 illustrated in FIG. 1. The incident optical fiber 107 of the electric field sensor head 101 in FIG. 1 is connected through a transmission optical fiber 113 to a light source 114 while the outgoing optical fiber 108 is connected through a reception optical fiber 115 to an optical detector 116. Although not shown in FIG. 2, a detected electric signal from the optical detector 116 is connected to an ordinary measuring unit such as a voltmeter, an ammeter, and a spectrum analyzer.

However, it is difficult to use the conventional electric field sensor of the type described in detection of a high electric field because, upon detection of the high electric field, the electrodes are easily damaged due to discharge of electric charge induced by the voltages applied to the two electrodes spaced at an interval as small as several microns to several tens of microns.

The conventional electric field sensor of the type described has another problem that a detection sensitivity is not so good. This is because electrode capacitance is generally increased in response to the length of the electrode.

It is an object of this invention to provide an electric field sensor adapted for use in detection of a high electric field.

It is another object of this invention to provide an electric field sensor having an excellent detection sensitivity.

SUMMARY OF THE INVENTION

According to the present invention an electric field sensor for measuring an electric field intensity existing in a space, comprises a sensor head including a substrate, and two branched optical waveguides formed on the substrate. The sensor head is arranged to be disposed within the space and has a structure such that an intensity of a light beam transmitted through the branched optical waveguides is varied in response to an electric field applied thereto to produce a varied light beam emitted therefrom. A light source is coupled to the sensor head such that emitted light from the source is incident to the branched optical waveguides. An optical detector is arranged to receive light output from the sensor head for detecting the varied light beam emitted from the sensor head. An electric field shielding member is arranged in the vicinity of at least one part of the two branched optical waveguides for shielding the two branched optical waveguides from said electric field in a non-symmetrical manner. The two branched optical waveguides are thus unbalancedly exposed to the applied electric field so as to produce said varied light beam emitted from the sensor head.

Preferably, the two branched optical waveguides have refractive indexes which are variable in response to an intensity of an electric field applied thereto.

DETAILED DESCRIPTION

Figure 1:
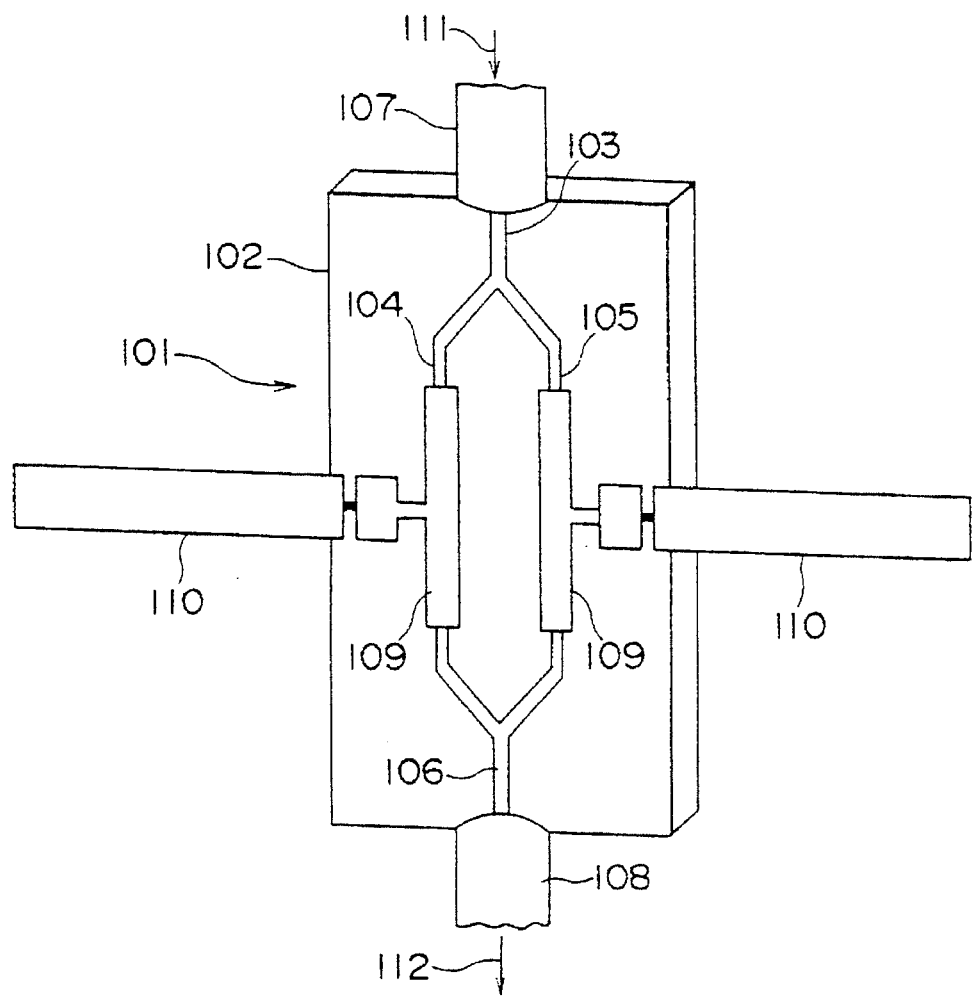
FIG. 1 is a perspective view of an electric field sensor head of a conventional electric field sensor.
Figure 2:
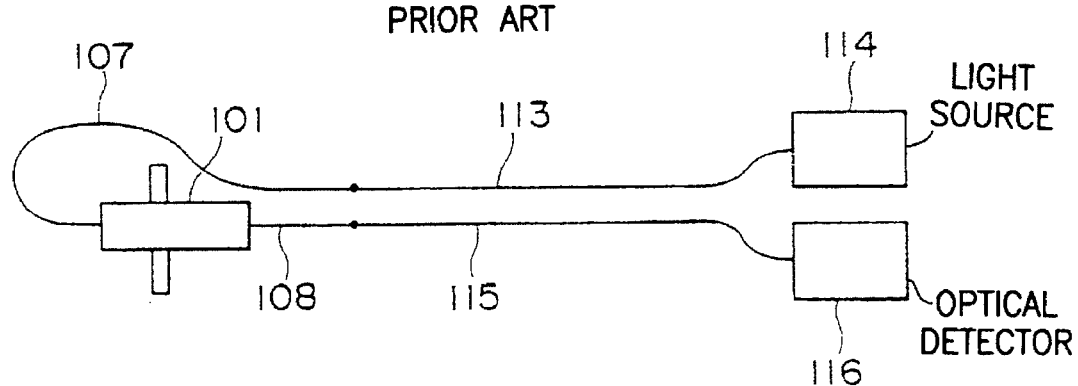
FIG. 2 is a schematic front view of the conventional electric field sensor.
Figure 3:
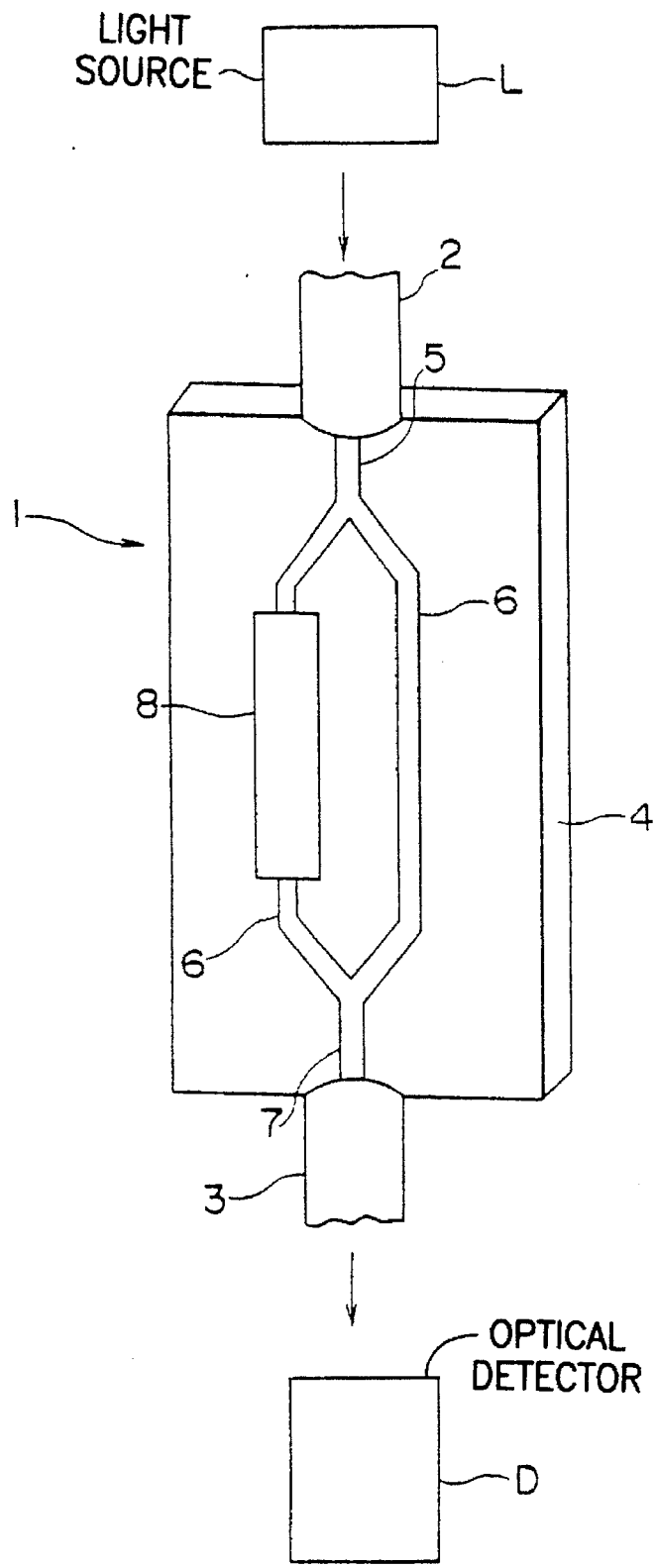
FIG. 3 is a perspective view of an embodiment of this invention.

Referring to FIG. 3, an electric field sensor according to a first embodiment of this invention comprises a sensor head 1, an incident optical fiber 2, an outgoing optical fiber 3, a light source L, and an optical detector D.

The sensor head 1 has a structure such that an intensity of a transmitted light beam is varied in response to an electric field intensity applied thereto. The incident optical fiber 2 and the outgoing optical fiber 3 are connected to the sensor head 1. The light source L comprises a semiconductor laser or the like. The light source L is coupled to one end of the incident optical fiber 2 and irradiates a light beam to the incident optical fiber 2. The optical detector D detects the transmitted light beam transmitted through the sensor head 1 and emitted from the outgoing optical fiber 3.

The sensor head 1 comprises a substrate 4, an incident optical fiber 5, two branched optical waveguides 6, an outgoing optical waveguide 7, and an electric field shielding member 8. The incident optical waveguide 5 is formed on the substrate 4 and is connected to the incident optical fiber 2. The branched optical waveguides 6 are formed on the substrate 4 to be branched from the incident optical waveguide 5 and have refractive which are variable in response to the intensity of an electric field applied thereto. The outgoing optical waveguide 7 is formed on the substrate 4 to join the branched optical waveguides 6, and is connected to the outgoing optical fiber 3. The electric field shielding member 8 is located in the vicinity of a part of the branched optical waveguides 6 and shields the electric field. The electric field shielding member 8 is made of a conductive material or a radio absorption material.

The electric field is shielded by the electric field shielding member 8 located on one of the branched optical waveguides 6. In the other one of the branched optical waveguides 6, the refractive index is varied in response to the applied electric field. As a consequence, a phase difference is produced in the outgoing optical waveguide 7 into which the branched optical waveguides 6 are joined. The intensity of the outgoing light beam, which corresponds to variation in intensity of the applied electric field, is detected.

More specifically, the branched optical waveguides 6 are formed on the substrate (Z plate) 4 made of a lithium niobate (LiNbO$_3$) crystal to be symmetrically branched. After the branched optical waveguides 6 are entirely coated with a silicon dioxide (SiO$_2$) film as a buffer layer for preventing light absorption, the electric field shielding member 8 made of metal is formed on a part of the branched optical waveguides 6.

Figure 4:
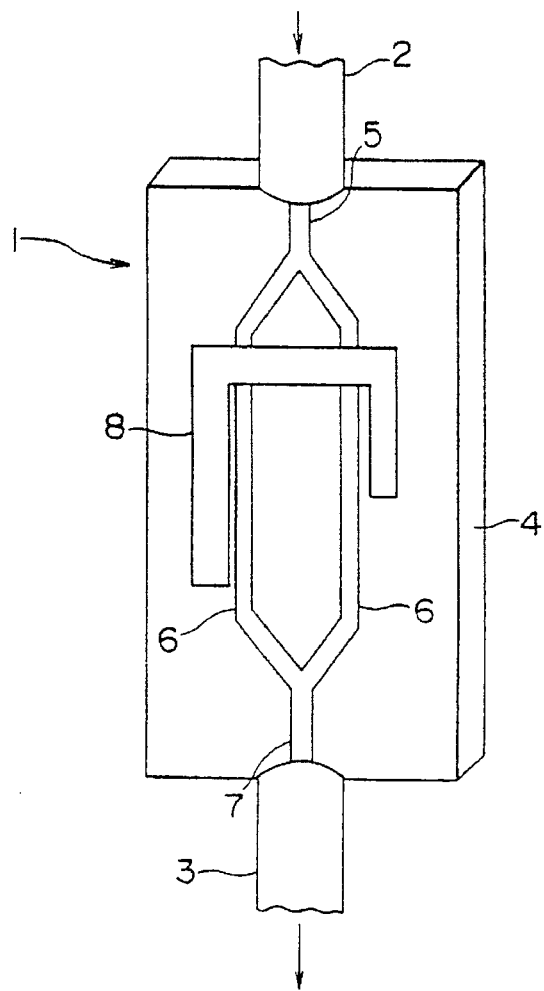
FIG. 4 is a perspective view of another embodiment of this invention.

FIG. 4 shows another embodiment of this invention. In the embodiment of FIG. 4, similar parts are designated by like reference numerals as those in the embodiment of FIG. 3. As illustrated in FIG. 4, the sensor head 1 comprises the electric field shielding member 8 formed on both of the branched optical waveguides 6. The electric field shielding member 8 has different lengths on the branched optical waveguides 6. The sensor head 1 in FIG. 4 has a characteristic substantially similar to that of the embodiment in FIG. 3.

Figure 5:
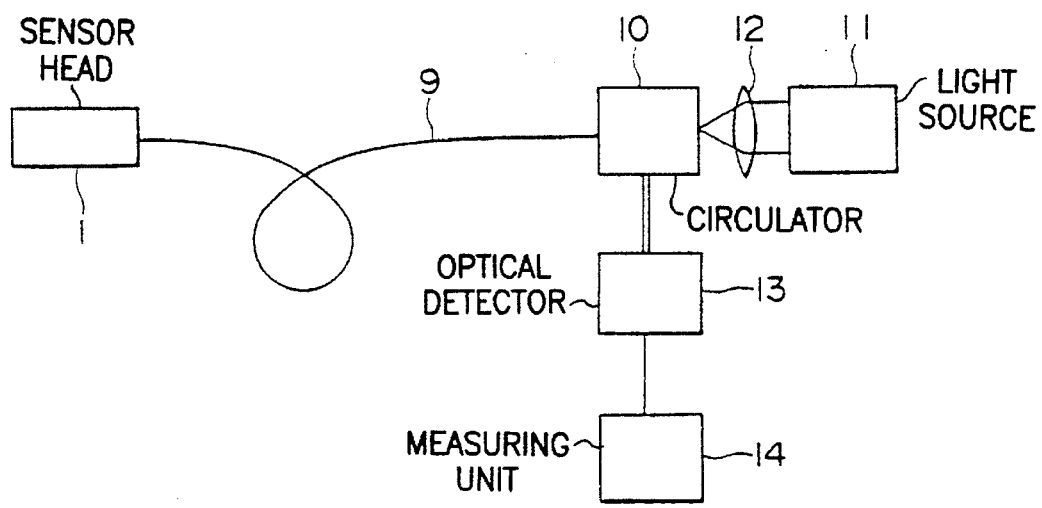
FIG. 5 is a schematic front view of another embodiment of this invention.

FIG. 5 shows another embodiment of this invention. In the embodiment of FIG. 5, similar parts are designated by like reference numerals as those in the embodiment of FIG. 3. The electric field sensor illustrated in FIG. 5 comprises the sensor head 1 having a structure such that an intensity of a transmitted light beam is varied in response to the electric field intensity applied thereto, an incident/outgoing optical fiber 9 connected to the sensor head 1, a circulator 10 coupled to an incident/outgoing end of the incident/outgoing optical fiber 9, a light source 11 for irradiating a light beam to the incident/outgoing optical fiber 9 through the circulator 10 and a lens 12, an optical detector 13 for detecting a transmitted light beam emitted from the circulator 10, and a measuring unit 14 for measuring a detection signal from the optical detector 13.

Figure 6:
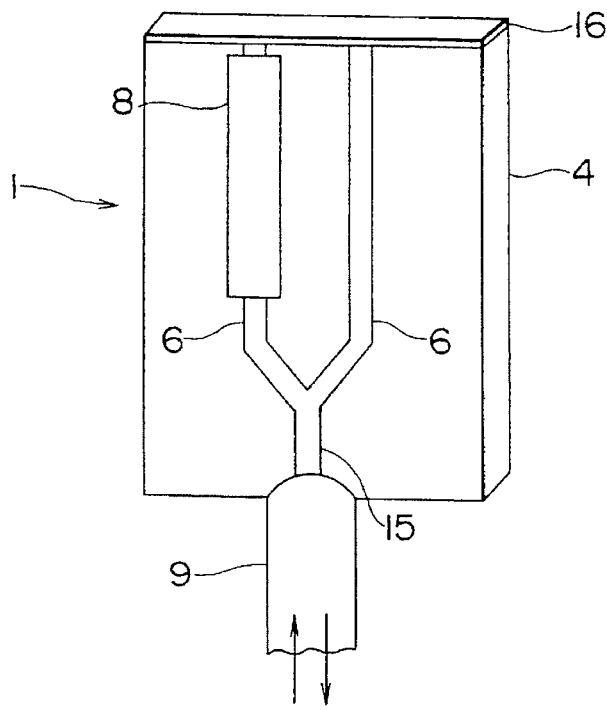
FIG. 6 is a perspective view of another embodiment of this invention.

As illustrated in FIG. 6, the sensor head 1 comprises the substrate 4 having an electrooptical effect, an incident/outgoing optical waveguide 15 formed on the substrate 4 and connected to the incident/outgoing optical fiber 9, the two branched optical waveguides 6 formed on the substrate 4 and branched from the incident/outgoing optical waveguide 15, a reflection mirror 16 formed on the substrate 4 for reflecting light beams from the branched optical waveguides 6, and the electric field shielding member 8 formed in the vicinity of a part of the branched optical waveguides 6 for shielding the electric field. The incident/outgoing optical fiber 9 comprises a polarization maintaining fiber. The reflection mirror 16 comprises a dielectric mirror, an ordinary mirror, or reflection coating.

In the embodiment illustrated in FIGS. 5 and 6, the electric field is shielded in an area where the electric field shielding member 8 is present. In the other branched optical waveguide 6, the refractive index is varied in response to the applied electric field. As a consequence, a phase difference between light waves is produced in the incident/outgoing optical waveguide 15 into which those waveguides are joined. The intensity of the outgoing light beam, which corresponds to variation in intensity of the applied electric field, is detected.

The electric field sensors illustrated in FIGS. 3 through 6 are adapted for use in detection of a high electric field because the electric field shielding member formed on the optical waveguide is a single unit and, therefore, free from electric discharge and resultant damage.

Figure 7:
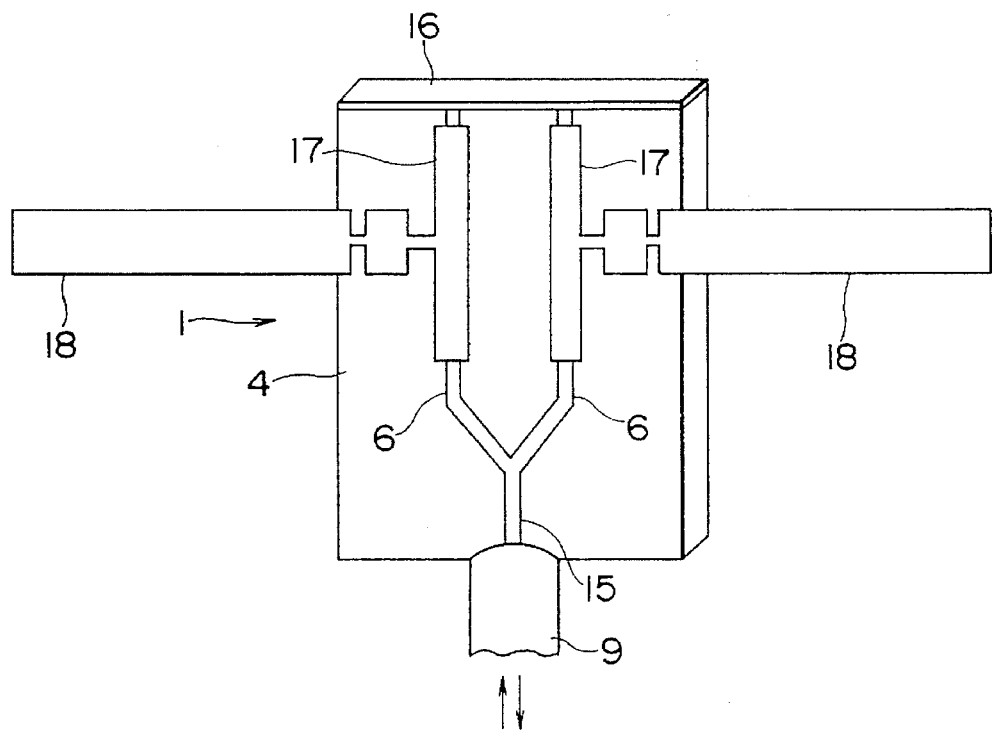
FIG. 7 is a perspective view of another embodiment of this invention.

Referring to FIG. 7, the electric field sensor head 1 excludes the electric field shielding member 8 in the embodiment of FIG. 6, and further comprises a pair of electrodes 17 formed on the branched optical waveguides 6 and antennas 18 connected to the electrodes 17.

The embodiment illustrated in FIG. 7 will be described more specifically. The substrate 4 is made of a crystal plate of lithium niobate (LiNbO$_3$). The incident/outgoing optical waveguide 15 is formed by diffusion of a titanium film pattern of a thickness between 40 and 100 nm at a temperature between 1000° and 1100° C. for 4 to 8 hours, and has a width between 5 and 10 μm.

The branched optical waveguides 6 have a length between 5 and 20 mm. The light reflector 16 is formed by coating an end surface of the substrate, that is perpendicular to the branched optical waveguides 6, with a metal film such as gold. The incident/outgoing optical waveguide 15 is coupled to the incident/outgoing optical fiber 9 of a polarization maintaining type. The electrodes 17 are formed on the branched optical waveguides 6 through a silicon dioxide film which serves as the buffer layer for preventing light absorption. The electrodes 17 are connected to the antennas 18.

In the embodiment illustrated in FIG. 7, a light wave having a polarization component perpendicular to the substrate 4 made of an LiNbO$_3$ crystal plate is incident through the incident/outgoing optical fiber 9 to the incident/outgoing optical waveguide 15, and then divided in energy into halves to be incident to the branched optical waveguides 6. In these branched optical waveguides 6, the halves of the light wave are subjected to phase shift in response to the electric field intensity applied from the outside and then emitted to the incident/outgoing optical waveguide 15. With the light intensity corresponding to the phase difference produced during propagation in the two branched optical waveguide 15, namely, the light intensity dependent upon the magnitude of the applied electric field, the halves of the light wave are coupled in the incident/outgoing optical waveguide 15 to be emitted to the incident/outgoing optical fiber 8.

Figure 8:
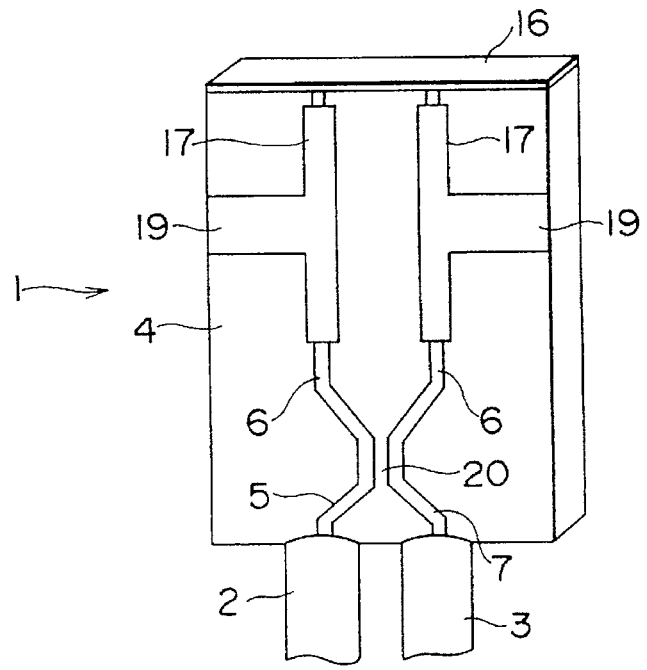
FIG. 8 is a perspective view of another embodiment of this invention.

An embodiment illustrated in FIG. 8 comprises, in the embodiment of FIG. 7, the incident optical waveguide and the outgoing optical waveguide 6 separate from each other, and antenna patterns 19 formed on the substrate 4 to be integral with the electrodes 17, respectively. The branched optical waveguides 6 are coupled to the incident optical waveguide 5 through an optical directional coupler 20. The other end of the optical directional coupler 20 is coupled to the outgoing optical waveguide 7.

An incident light beam from the incident optical waveguide 5 is divided by the optical directional coupler 20 into halves to be incident to the branched optical waveguides 6 and then returned to the optical directional coupler 20 with phase shift corresponding to the electric field intensity. In the optical directional coupler 20, return light beams are entirely coupled to the incident optical waveguide 5 when the phase shift is equal to zero. When the phase shift is not equal to zero, the return light beams are coupled to the outgoing optical waveguide 7 to be directed to the outgoing optical fiber 3 with the light intensity reduced in dependence upon the magnitude of the phase shift.

Figure 9:
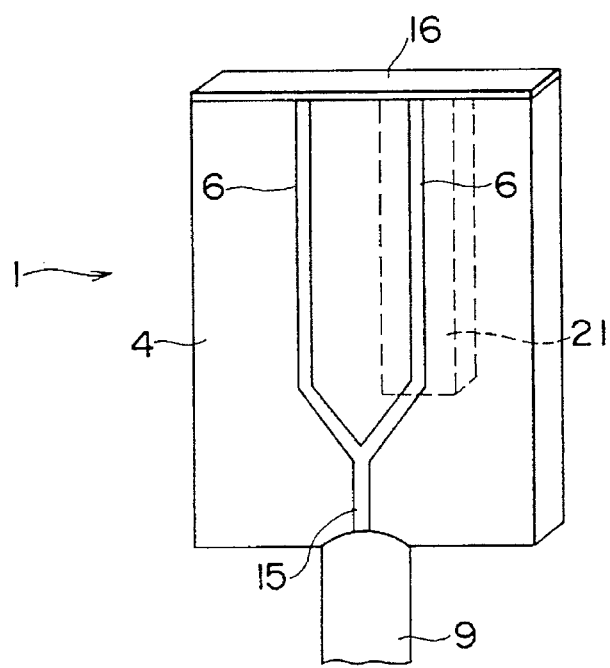
FIG. 9 is a perspective view of another embodiment of this invention.

An embodiment illustrated in FIG. 9 does not include the electric field shielding member 8 in the embodiment of FIG. 6 but has, in an area of the substrate where one of the branched optical waveguides 6 is formed, a reversely polarized portion 21 where a polarization direction of the crystal is reversed by 180 degrees with respect to the remaining portion. The reversely polarized portion 21 is formed by placing a titanium film on a portion to be reversed and then giving a drastic temperature variation or irradiating an electron beam to the portion to be reversed. To form the optical waveguide on the reversely polarized portion 21, use is made of a proton exchange technique accompanied with an annealing process.

According to this embodiment, when the electric fields of a same direction are applied to the two branched optical waveguides 6, the refractive indexes are varied in opposite directions because the polarization directions are reverse to each other. A phase difference is produced between the two branched optical waveguides 6. Therefore, it is unnecessary according to this embodiment to provide the electrodes. The optical electric field sensor head 1 of this embodiment is adapted for use in detection of an electric field within a small space because an extremely small size is achieved and also for use in detection of a high electric field requiring a high voltage durability because no metal electrode is included.

Figure 10:
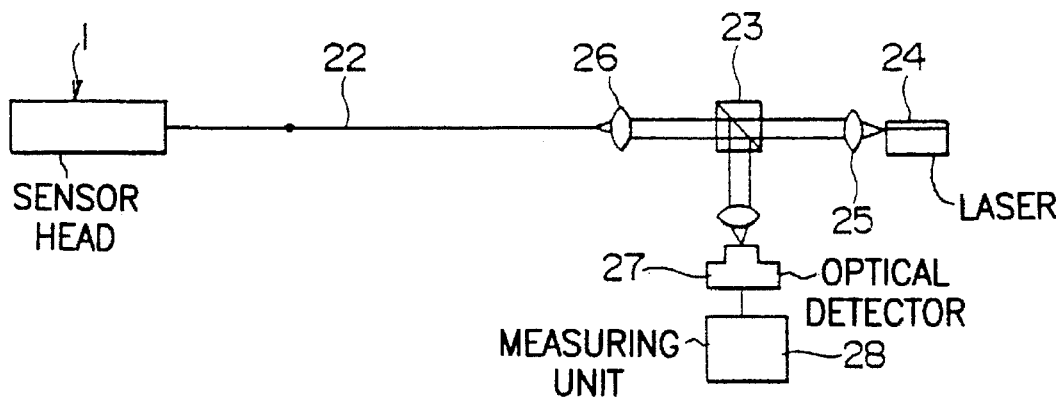
FIG. 10 is a schematic front view of another embodiment of this invention.

In an electric field sensor illustrated in FIG. 10, the incident/outgoing optical fiber 9 of the electric field sensor head 1 illustrated in any one of FIGS. 6 through 9 is connected to a polarization maintaining optical fiber 22 for transmission and reception. In this embodiment, a half mirror 23 is used as a beam splitter. A light beam emitted from a semiconductor laser 24 is collimated by a lens 25. A half of its energy passes through the half mirror 23 and coupled by a lens 26 to the optical fiber 22 to be transmitted to the electric field sensor head 1. On the other hand, a return light beam from the optical fiber 22 is collimated by the lens 26 and a half of its energy is reflected by the half mirror 23 to be coupled to an optical detector 27. A detection electric signal is sent to a measuring unit 28.

Figure 11:
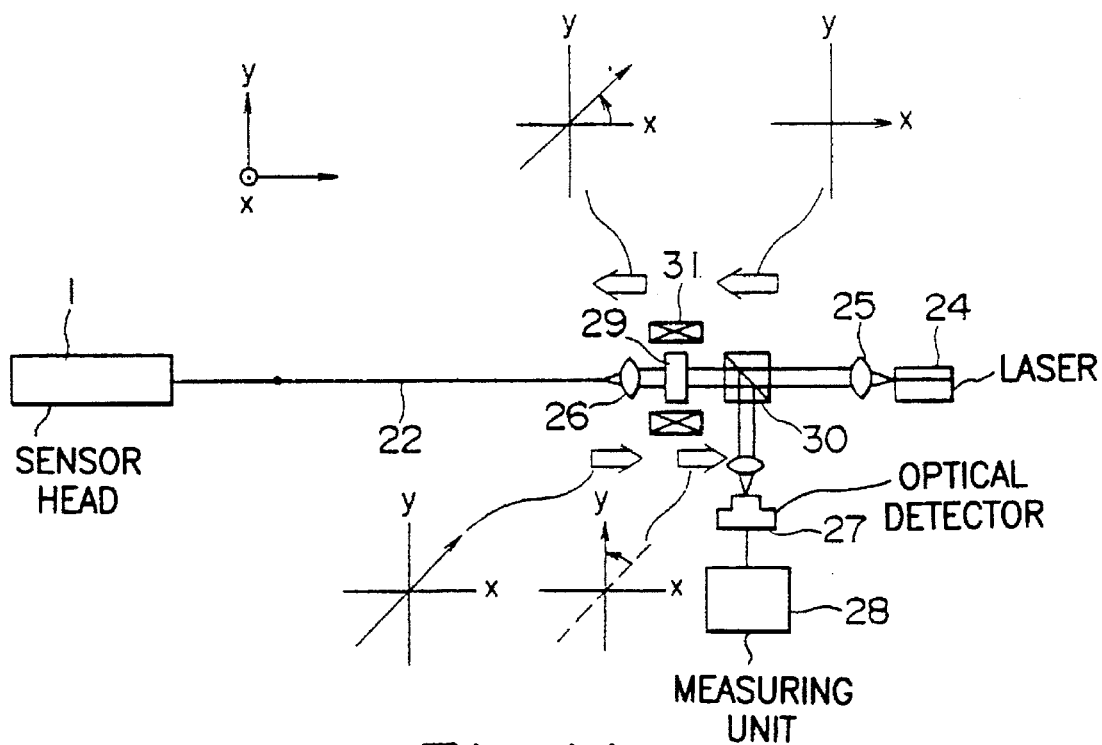
FIG. 11 is a schematic front view of another embodiment of this invention.

In an electric field sensor illustrated in FIG. 11, the optical fiber of the electric field sensor head 1 illustrated in any one of FIGS. 6 through 9 is connected to the optical fiber 22 for transmission and reception. In this embodiment, a circulator comprising a garnet film 29 and a polarization prism 30 is used as the beam splitter. An incident light beam emitted from the semiconductor laser 24 and polarized in a direction x is collimated by the lens 25, passes through the polarization prism 30 with its energy substantially maintained, and is incident to the garnet film 29 having the Faraday effect. The garnet film 29 is applied with a magnetic field by a magnet 31 so that the polarization direction of the incident light beam is rotated by 45 degrees.

The polarization direction is maintained in the optical fiber 22 and the electric field sensor head 1. Therefore, the polarization direction of the return light beam from the optical fiber 22 is coincident with that of the incident light beam incident to the optical fiber 22. While the return light beam passes through the garnet film 30, the polarization direction is further rotated by 45 degrees. Accordingly, the return light beam becomes a polarization wave perpendicular to the incident light beam and is reflected by the polarization prism 30, with its energy substantially maintained, to be coupled to the optical detector 27. This embodiment is advantageous in that optical energy loss is considerably suppressed. Thus, a sensor of a higher sensitivity is obtained.

Industrial Applicability

This invention is adapted for use in a device for detecting a high electric field and in a device required to have a high sensitivity.

I claim:

1. An electric field sensor for measuring an electric field intensity existing in a space, comprising:

a sensor head including a substrate, and two branched optical waveguides formed on said substrate;

said sensor head being arranged to be disposed within said space and having a structure such that an intensity of a light beam transmitted through said branched optical waveguides is varied in response to an electric field applied thereto to produce a varied light beam emitted therefrom;

a light source coupled to said sensor head, said light source emitting light, and wherein the emitted light is coupled so as to be incident to said branched optical waveguides;

an optical detector arranged to receive light output from said sensor head for detecting said varied light beam emitted from said sensor head; and an electric field shielding member arranged in the vicinity of at least one part of said two branched optical waveguides for shielding said at least one part of said two branched optical waveguides from said electric field, so that said two branched optical waveguides are shielded in a non-symmetrical manner and are unbalancedly exposed to said applied electric field so as to produce said varied light beam emitted from the sensor head.

2. The electric field sensor of claim 1, wherein said sensor head further comprises:

an incident optical waveguide and an outgoing optical waveguide, both of said incidental and outgoing optical waveguides being formed on said substrate;

said incident optical waveguide having an input port at an end thereof and being coupled, at an opposite end thereof, to first ends of said two branched optical waveguides;

said outgoing optical waveguide having an output port at an end thereof and being coupled, at an opposite end thereof, to ends of said two branched optical waveguides which are opposite said first ends;

said input port of said incident optical waveguide being coupled with said light source through an incident optical fiber; and said output port of said outgoing optical waveguide being coupled with said optical detector through an outgoing optical fiber.

3. The electric field sensor of claim 2, wherein said two branched optical waveguides have refractive indexes which are variable in response to an intensity of an electric field applied thereto.

4. The electric field sensor of claim 1, wherein said electric field shielding member is disposed along only one of said two branched optical waveguides.

5. The electric field sensor of claim 4, wherein said two branched optical waveguides have refractive indexes which are variable in response to an intensity of an electric field applied thereto.

6. The electric field sensor of claim 1, wherein:

said electric field shielding member has two portions, each portion of said electric field shielding member extending along a respective one of said two branched optical waveguides; and said two portions of said electric field shielding member each have different lengths from each other in the extending directions of said portions of said electric field shielding member.

7. The electric field sensor of claim 6, wherein said two branched optical waveguides have refractive indexes which are variable in response to an intensity of an electric field applied thereto.

8. The electric field sensor of claim 1, wherein said two branched optical waveguides have refractive indexes which are variable in response to an intensity of an electric field applied thereto.

* * * * *